(12) United States Patent
Song

(10) Patent No.: US 11,789,578 B2
(45) Date of Patent: Oct. 17, 2023

(54) TOUCH DISPLAY DEVICE AND DISPLAY PANEL WITH IMPROVED TOUCH SENSITIVITY

(71) Applicant: LG Display Co., Ltd., Seoul (KR)

(72) Inventor: MinSeob Song, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 19 days.

(21) Appl. No.: 16/909,868

(22) Filed: Jun. 23, 2020

(65) Prior Publication Data
US 2021/0149527 A1 May 20, 2021

(30) Foreign Application Priority Data
Nov. 20, 2019 (KR) .......................... 10-2019-0149792

(51) Int. Cl.
  *G06F 3/041* (2006.01)
  *G06F 3/044* (2006.01)
  *G06F 3/047* (2006.01)

(52) U.S. Cl.
CPC ............ *G06F 3/0447* (2019.05); *G06F 3/047* (2013.01); *G06F 3/0412* (2013.01); *G06F 3/04142* (2019.05); *G06F 2203/04112* (2013.01)

(58) Field of Classification Search
CPC .. G06F 3/0447; G06F 3/04142; G06F 3/0412; G06F 3/047; G06F 2203/04112
See application file for complete search history.

(56) References Cited

U.S. PATENT DOCUMENTS

| | | | |
|---|---|---|---|
| 9,052,768 B2 | 6/2015 | Kurasawa et al. | |
| 2013/0015865 A1 | 1/2013 | Izumi | |
| 2014/0292715 A1* | 10/2014 | Liu | G06F 3/044 |
| | | | 345/174 |
| 2018/0046301 A1 | 2/2018 | Zhou et al. | |
| 2018/0095571 A1 | 4/2018 | Park et al. | |
| 2019/0121474 A1 | 4/2019 | Lee et al. | |
| 2019/0155424 A1 | 5/2019 | Nukui et al. | |
| 2019/0377438 A1* | 12/2019 | Kim | G06F 3/044 |
| 2020/0381485 A1 | 12/2020 | Cai | |

FOREIGN PATENT DOCUMENTS

| | | |
|---|---|---|
| CN | 106816457 B | 8/2019 |
| CN | 110308815 A | 10/2019 |
| TW | 201439863 A | 10/2014 |
| TW | 201411464 A | 3/2016 |
| TW | 201823949 A | 7/2018 |

* cited by examiner

*Primary Examiner* — Wing H Chow
(74) *Attorney, Agent, or Firm* — Seed IP Law Group LLP

(57) ABSTRACT

Present disclosure provides a touch display device comprising a display panel including an inner area forming a first step between a first touch electrode metal with first critical dimension and a lower electrode layer, and an edge area having at least one of CD compensation area, which is located outside of the inner area, forming a second step between a second touch electrode metal with second critical dimension larger than the first critical dimension and the lower electrode layer; and a touch circuit for sensing touch presence or touch location by using a touch sensing signal received from the touch electrode metals.

10 Claims, 11 Drawing Sheets

TOUCH DISPLAY DEVICE AND DISPLAY PANEL WITH IMPROVED TOUCH SENSITIVITY

CROSS REFERENCE TO RELATED APPLICATION

This application claims priority from Korean Patent Application No. 10-2019-0149792, filed on Nov. 20, 2019, which is hereby incorporated by reference for all purposes as if fully set forth herein.

BACKGROUND

Technical Field

Embodiments of the present disclosure relate to a touch display device, and more particularly, to a touch display device and a display panel capable of improved touch sensitivity.

Description of Related Art

Along with the development of the information society, demands for display devices that display images are growing. In this regard, various types of display devices, such as liquid crystal display (LCD) devices, plasma display panel (PDP) display devices, and organic light emitting diode (OLED) display devices, have recently become popular.

Among these display devices, there is a touch display device with a touch-based input structure that allows the user to easily, intuitively and conveniently input information or commands by escaping from a conventional input method such as a button, a keyboard, and a mouse.

Such a touch display device should grasp the presence or absence of a user's touch and accurately detect touch coordinates in order to provide a touch-based input structure.

To this end, among various touch sensing methods, capacitance-based touch sensing method is widely used for detecting presence or absence of touch and touch coordinates based on a change in capacitance formed on a plurality of touch electrodes on a display panel.

Moreover, the edge area of the display panel is recently used as a region capable of displaying and touching in view of design.

BRIEF SUMMARY

The inventors have realized that since a step between a touch electrode metal and a lower electrode layer decreases due to the curvature of the display panel in the edge area of the touch display device, there is a problem that decreases the touch sensitivity due to an undesirable parasitic capacitance.

Based on the inventors work in fully locating and appreciating these issues, the inventors proposed to provide a touch display device and a display panel capable of obtaining improved touch sensitivity by compensation for the critical dimension of touch electrode metals formed in the edge area of the display panel.

In addition, the inventors of the present disclosure provide a touch display device and a display panel capable of effective touch sensing by variously modifying the compensation for the critical dimension of touch electrode metals formed in edge area of the display panel.

The problems to be solved according to the embodiments of the present disclosure, which will be described below, are not limited to the problems mentioned above, and other problems that are not mentioned will be clearly understood by those skilled in the art from the below description.

A touch display device according to one or more embodiments of the present disclosure includes a display panel comprised of an inner area forming a first step between first touch electrode metals with first critical dimension and lower electrode layer and an edge area having at least one of CD compensation area, which is located outside of the inner area, forming a second step between second touch electrode metals with second critical dimension larger than the first critical dimension and the lower electrode layer, and a touch circuit for sensing touch presence or touch location by using a touch sensing signal received from the touch electrode metals.

In the touch display device according to one or more embodiments of the present disclosure, the first step is maintained at a constant value.

In the touch display device according to one or more embodiments of the present disclosure, the lower electrode layer is a cathode electrode of a light emitting element.

In the touch display device according to one or more embodiments of the present disclosure, the second critical dimension has a value larger than the first critical dimension by a constant gap.

In the touch display device according to one or more embodiments of the present disclosure, the second step has a smaller size than the first step and is maintained at a constant value.

The touch display device according to one or more embodiments of the present disclosure further includes a step decline area in which the step between the touch electrode metal and the lower electrode layer decreases adjacent to the CD compensation area.

In the touch display device according to one or more embodiments of the present disclosure, a step decline rate of the step decline area is the same or different when the step decline area is formed as a plurality of areas.

In the touch display device according to one or more embodiments of the present disclosure, the critical dimension of the touch electrode metal formed in the CD compensation area increases as the distance from the inner area increases when the CD compensation area is formed as a plurality of areas.

In the touch display device according to one or more embodiments of the present disclosure, the critical dimension of the touch electrode metal formed in the CD compensation area increases at a constant rate as the distance from the inner area increases.

A display panel according to one or more embodiments of the present disclosure includes an inner area forming a first step between first touch electrode metals with first critical dimension and lower electrode layer, and an edge area having at least one of CD compensation area, which is located outside of the inner area, forming a second step between second touch electrode metals with second critical dimension larger than the first critical dimension and the lower electrode layer.

According to embodiments of the present disclosure, it is possible to obtain improved touch sensitivity by CD compensation for the edge area of the display panel.

Further, according to embodiments of the present disclosure, there is an effect capable of effectively sensing the touch by variously modifying the CD compensation for the edge area of the display panel.

Advantages of the embodiments of the present disclosure are not limited to the above advantages. The embodiments of the present disclosure can achieve advantages which have not been mentioned above and will be apparently understood from the following description by those skilled in the art.

BRIEF DESCRIPTION OF THE SEVERAL VIEWS OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
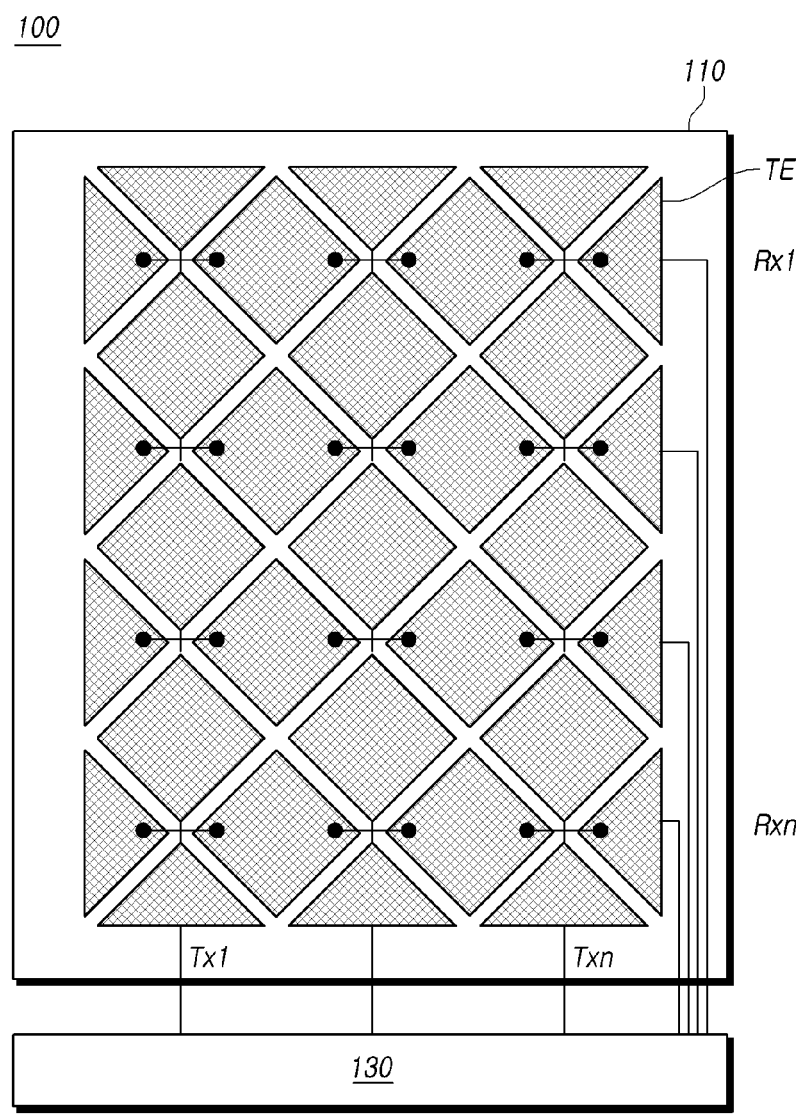
FIG. 1 is a diagram schematically illustrating a touch display device according to one or more embodiments of the present disclosure.

Advantages and features of the present disclosure and methods for achieving the advantages or features will be apparent from embodiments described below in detail with reference to the accompanying drawings. However, the disclosure is not limited to the embodiments but can be modified in various forms. The embodiments are provided merely for completing the disclosure of the disclosure and are provided for completely informing those skilled in the art of the scope of the disclosure. The scope of the disclosure is defined by only the appended claims.

Shapes, sizes, ratios, angles, number of pieces, and the like illustrated in the drawings, which are provided for the purpose of explaining the embodiments of the disclosure, are exemplary and thus the disclosure is not limited to the illustrated details. In the following description, like elements are referenced by like reference numerals. When it is determined that detailed description of the relevant known functions or configurations involved in the disclosure makes the gist of the disclosure obscure, the detailed description thereof will not be made. When "include," "have", "be constituted", and the like are mentioned in the specification, another element may be added unless "only" is used. A singular expression of an element includes two or more elements unless differently mentioned.

In constructing elements in embodiments of the disclosure, an error range is included even when explicit description is not made.

For example, when positional relationships between two parts are described using 'on,' 'over,' and the like, one or more other parts may be disposed between the two parts unless 'just' or 'direct' is used.

In describing temporal relationships, for example, when the temporal order is described using 'after,' 'subsequent,' and 'before,' a case which is not continuous may be included unless 'just' or 'direct' is used.

In describing signal transmission relationships, for example, when 'a signal is transmitted from node A to node B,' a case in which the signal is transmitted from node A to node B via another node may be included unless 'just' or 'direct' is used.

It will be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of embodiments of the disclosure can be coupled or combined with each other or separated from each other partially or on the whole and can be technically interlinked and driven in various forms. The embodiments may be put into practice independently or in combination.

Hereinafter, various embodiments of the present disclosure will be described in detail with reference to the accompanying drawings.

FIG. 1 is a diagram schematically illustrating a touch display device according to one or more embodiments of the present disclosure.

Referring to FIG. 1, a touch display device 100 according to one or more embodiments of the present disclosure may provide an image display function for displaying an image and a touch sensing function for sensing a user's touch.

The touch display device 100 may include a display panel 110 in which data lines and gate lines are disposed for displaying an image, and a display driving circuit for driving the display panel 110.

The display driving circuit functionally may include a data driving circuit for driving the data lines, a gate driving circuit for driving the gate lines, and a timing controller for controlling the data driving circuit and the gate driving circuit. The display driving circuit may be implemented with one or more integrated circuits.

The touch display device 100 may include a touch screen panel in which a plurality of touch electrode TE are disposed for touch sensing, and a touch circuit 130 for driving of the touch screen panel and sensing touch.

The touch screen panel of the touch display device 100 may be an external type that is manufactured separately from the display panel 110 and bonded to the display panel 110, or may be an embedded type that is manufactured together with the display panel 110 and located inside the display panel 110. Hereinafter, it will be described on the assumption that the touch screen panel is embedded in the display panel 110.

The touch circuit 130 supplies a touch driving signal to the display panel 110 to drive the display panel 110, receives a touch sensing signal from the display panel 110, and detects touch presence and touch coordinates based on it.

The touch circuit 130 may be implemented by including a touch driving circuit that supplies touch driving signals and receives touch sensing signals, and a touch controller that detects touch presence and touch coordinates.

The touch circuit 130 may be implemented as one or more components (e.g., an integrated circuit), or may be implemented separately from the display driving circuit.

In addition, all or part of the touch circuit 130 may be implemented by being integrated with a display driving circuit or an internal circuit thereof. For example, the touch driving circuit of the touch circuit 130 may be implemented as an integrated circuit together with the data driving circuit of the display driving circuit.

Meanwhile, the touch display device 100 may detect touch presence and touch coordinates based on capacitance formed on the touch electrode TE.

The touch display device 100 may detect a touch in a mutual-capacitance method or in a self-capacitance method as capacitance-based touch sensing method.

In a case of a touch sensing based on mutual-capacitance method, a plurality of touch electrode TE may be composed of driving electrodes receiving touch driving signals through touch driving line Tx, and sensing electrodes transmitting touch sensing signals through touch sensing line Rx by forming capacitance with the driving electrodes. The touch driving line Tx and the touch sensing line Rx may be referred to as a touch line.

The touch sensing based on the mutual-capacitance method detects the touch presence and the touch coordinates based on the change of the mutual-capacitance generated between the driving electrodes and the sensing electrodes according to the pointer presence such as a finger or a pen (including a digital pen or a smart pen).

In a case of the touch sensing based on the self-capacitance method, each touch electrode TE serves as both a driving electrode and a sensing electrode. That is, a touch driving signal is applied to a touch electrode TE, and a touch sensing signal is transmitted from the touch electrode TE to which the touch driving signal is applied. Therefore, in the touch sensing based on the self-capacitance method, there is no distinction between the driving electrode and the sensing electrode.

As described above, the touch display device 100 may detect a touch by the mutual-capacitance method, or may detect a touch by the self-capacitance method.

The touch circuit 130 sequentially outputs touch driving signals to the plurality of touch electrode TE through the touch driving line Tx in the touch sensing period.

When a user touches the display panel 110 while touch driving signal is applied to the touch electrode TE, capacitance of the touch electrode TE is changed.

The touch driving line Tx transmitting the touch driving signals may be disposed in a direction parallel to the data lines disposed on the display panel 110, and the touch sensing line Rx transmitting the touch sensing signals may be disposed in a direction parallel to the gate lines disposed on the display panel 110.

In general, the touch driving line Tx extends in the long axis direction of the display panel 110, and the touch sensing line Rx extends in the short axis direction of the display panel 110. However, the arrangement of the touch driving line Tx and the touch sensing line Rx may be changed according to the shape or structure of the touch display device 100.

In a case that the display panel 110 simultaneously performs display driving and touch sensing, a touch driving signal may be applied and touch sensing may be performed while a scan signal is applied to the gate line disposed on the display panel 110.

Figure 2:
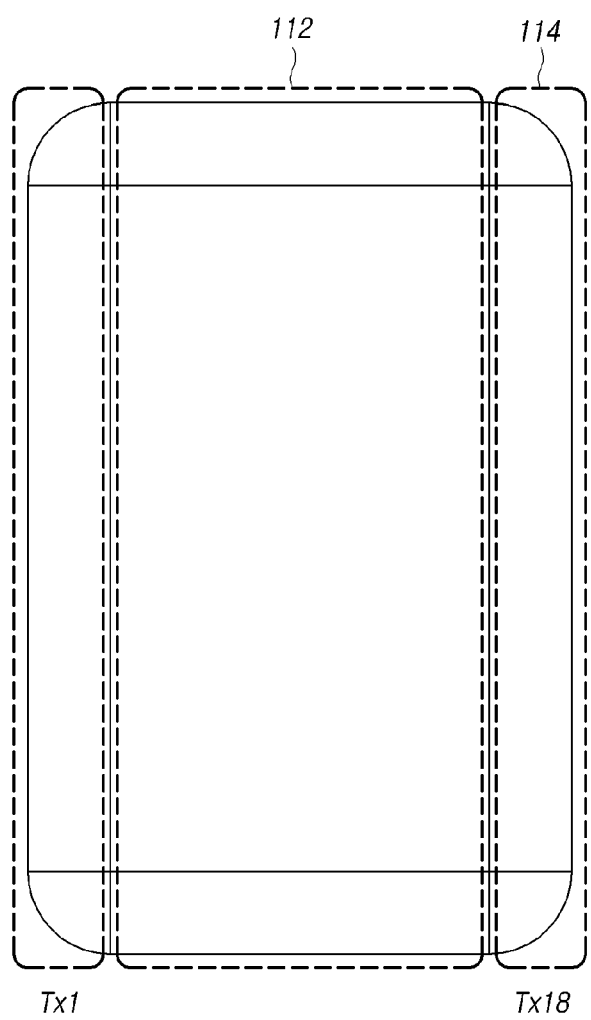
FIG. 2 is a diagram illustrating areas in which touch electrodes are disposed in a display panel according to one or more embodiments of the present disclosure.

FIG. 2 is a diagram illustrating areas in which touch electrodes are disposed in a display panel according to one or more embodiments of the present disclosure.

Referring to FIG. 2, an area in which the touch electrode TE is disposed in the display panel 110 according to one or more embodiments of the present disclosure may be divided into a first area 112 and a second area 114. In some embodiments, the first area 112 may also be referred to as an inner area 112 as it is in a central region and the second area 114 is in a peripheral region. In some embodiments, the second area 114 may be located adjacent to the first area 112 and may have sub-areas within the second area 114. For example, the second area 114 may be referred to as an edge area 114 as it is adjacently located at both sides of the first area 112.

The inner area 112 is a region of the central portion surrounded by the left and right edge areas 114, and may be a region formed in a flat planar structure. Also, a plurality of touch electrode TE with a constant step (e.g., a dimension such as height) from the lower electrode layer of the display panel 110 may be formed in the inner area 112.

Therefore, since the step between the touch electrode TE and the lower electrode layer is constant in the inner area 112, the capacitance value according to the location in the inner area 112 may be constant.

The edge area 114 is a region extending to a vertical direction in the left or right side of the inner area 112, and may be formed in a flat planar structure according to a structure of the display panel 110. However, the edge area 114 is recently formed as a round structure with some curvature in a latest touch display device 100 with a touch function made of a streamlined structure.

Meanwhile, the edge area 114 may be located on the left or right side of the inner area 112, but may be located on the upper or lower side of the inner area 112 according to the type of the display panel 110.

In this way, since the step between the touch electrode TE or the touch line and the lower electrode layer gradually decreases as it goes outward from the inner area 112 when the edge area 114 is formed in a round structure, the capacitance value due to touch sensing is decreased so that the touch sensitivity is reduced compared to the inner area 112.

At this time, corner area of the upper or lower edge area 114 may also be formed in a round shape, and may be included in the edge area 114.

Figure 3:
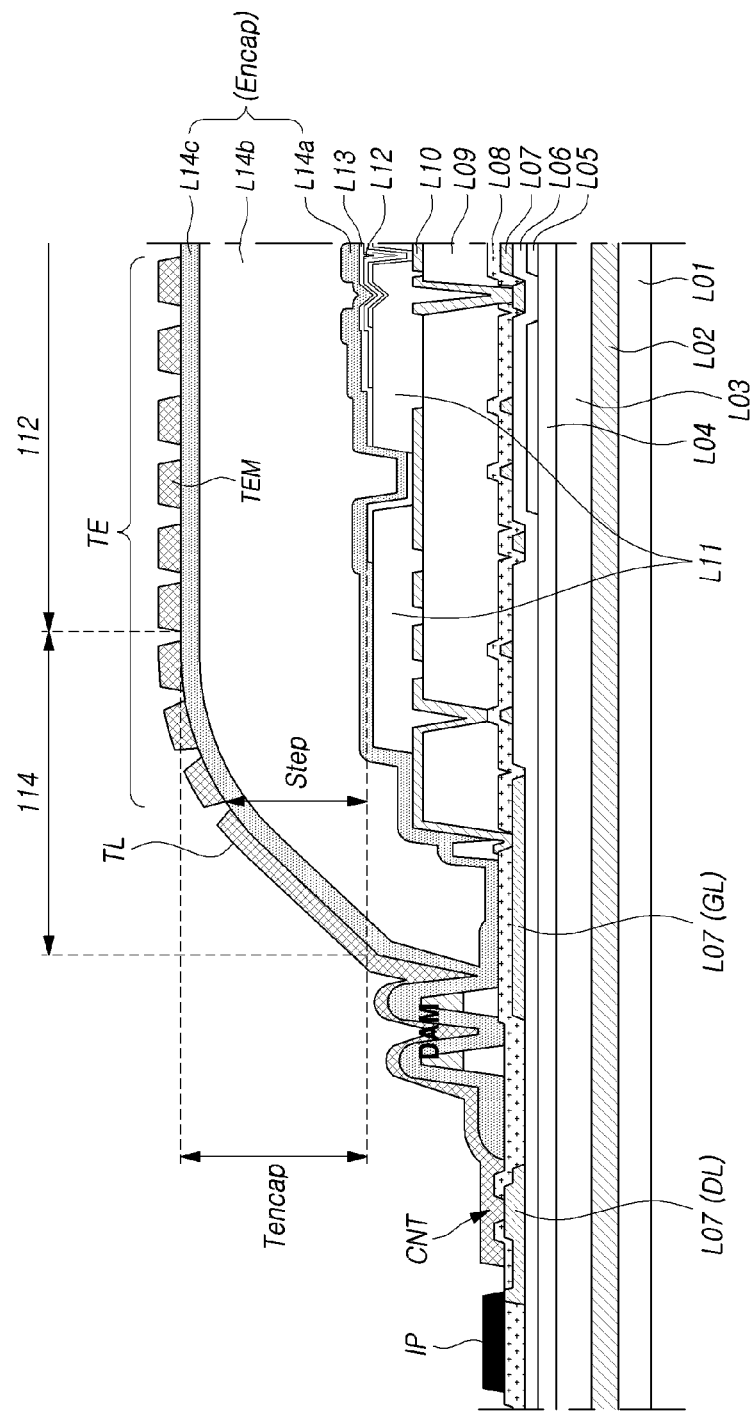
FIG. 3 is a diagram illustrating a cross-section of a display panel in a touch display device.

FIG. 3 is a diagram illustrating a cross-section of a display panel in a touch display device.

Referring to FIG. 3, in the display panel 110 of the touch display device 100, a polyimide (PI) layer L02 is located on a substrate or back plate L01.

A buffer layer L03 may be located on the polyimide layer L02, and an interlayer insulating film L04 may be located on the buffer layer L03.

A gate layer L05 may be present on the interlayer insulating film L04, and gate electrodes or the like may be provided on necessary positions of the gate layer L05.

A gate insulating film L06 may be present on the gate layer L05.

A source/drain layer L07 may be present on the gate insulating film L06.

Signal lines such as data line DL and gate line GL, and source/drain electrodes of a plurality of transistors may be provided on the source/drain layer L07.

A passivation layer L08 may be present on the source/drain layer L07.

A planarization layer L09 may be located on the passivation layer L08, and a first electrode layer L10 may be present on the planarization layer L09, in the emission positions corresponding to the subpixels.

A bank layer L11 is located on the first electrode layer L10, and an organic light-emitting layer L12 is located on the bank layer L11.

A second electrode layer L13 commonly provided in all subpixel areas may be present on the organic light-emitting layer L12.

An encapsulation layer L14 may be present on the second electrode layer L13 to prevent infiltration of moisture, air, or the like.

A dam DAM may be present on a peripheral portion of the display panel 110.

The encapsulation layer L14 may be a single layer or a two or more multi layers.

In addition, the encapsulation layer L14 may be a composite layer comprised of one or more organic material layers and one or more inorganic material layers.

Here, the encapsulation layer L14 is illustrated as being a multilayer comprised of a first encapsulation layer L14a, a second encapsulation layer L14b, and a third encapsulation layer L14c.

Each of the first encapsulation layer L14a, the second encapsulation layer L14b, and the third encapsulation layer L14c may be comprised of an organic material layer and an inorganic material layer.

The touch electrode TE and the touch line TL are provided on the encapsulation layer L14.

In some embodiments, the touch electrode TE may be formed in a plate structure without an opening region, or may be formed in a mesh structure. The touch electrode TE of a mesh structure is formed as a touch electrode metal TEM patterned in a mesh shape, so that a plurality of opening regions may be formed. In other embodiments, the touch electrode TE have other shapes and arrangements.

The touch line TL electrically connected to the corresponding touch electrode TE on the encapsulation layer L14 extends to region without the touch electrode TE so as not to overlap with the touch electrode TE.

The touch line TL bypasses a region in which the dam DAM is located, and extends to a region outside of the dam DAM, e.g., a portion adjacent to an integrated pad IP.

In addition, in the area outside of the dam DAM, the touch line TL may be connected to the data line DL on the source/drain layer L07 via contact hole CNT.

The data line DL is electrically connected to the integrated pad IP in the region outside of the dam DAM.

The touch line TL and the touch electrode TE may be located on the same layer or different layers while being located on the encapsulation layer L14.

The encapsulation layer L14 may have a selected thickness or a predetermined thickness Tencap in the inner area 112 and may have an influence on a time delay and touch sensitivity during the touch driving process and the touch sensing process.

Accordingly, the thickness Tencap of the encapsulation layer L14 must be designed in consideration of the time delay and the touch sensitivity due to the touch driving.

As described above, the display panel 110 according to embodiments may have a touch-on-encapsulation (TOE) structure in which touch electrode metal TEM and the touch line TL are located on the encapsulation layer L14.

In addition, in this structure of the display panel 110, the step between the touch electrode TE formed on the encapsulation layer L14 and the second electrode layer L13 corresponding to the cathode of a light-emitting element decrease in the direction toward a rounded edge area 114.

Such a decrease in the step between the touch electrode TE and the lower second electrode layer L13 may cause capacitance values in the edge area 114 to be lower than those in the planar inner area 112, so that touch sensitivity may be decreased.

Figure 4:
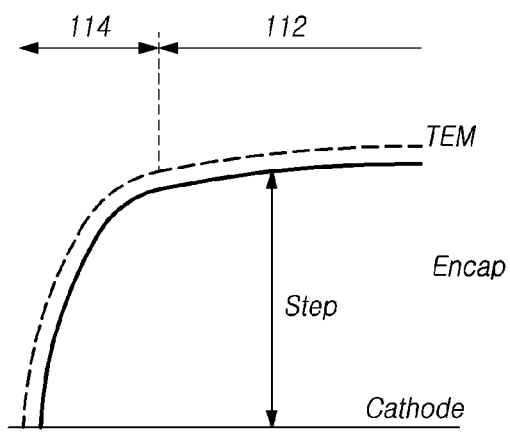
FIG. 4 is a cross-sectional view schematically illustrating a step between touch electrode metals and a lower electrode layer in an inner area and an edge area of a touch display device.
Figure 5:
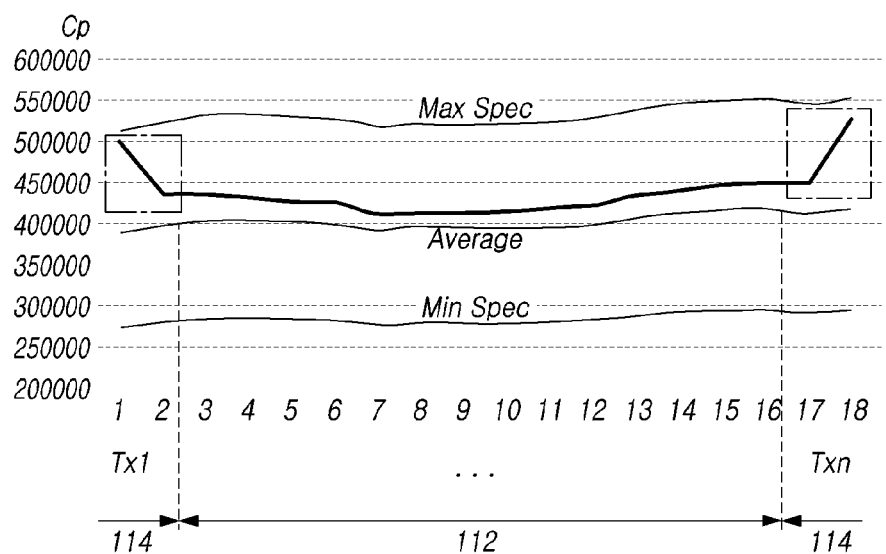
FIG. 5 is a diagram illustrating a change in capacitance due to the steps between touch electrode metals and a lower electrode layer in an inner area and an edge area of a touch display device.

FIG. 4 is a cross-sectional view schematically illustrating a step between touch electrode metals and a lower electrode layer in an inner area and an edge area of a touch display device, and FIG. 5 is a diagram illustrating a change in capacitance due to the steps between touch electrode metals and a lower electrode layer in an inner area and an edge area of a touch display device.

Referring to FIG. 4 and FIG. 5, in the touch display device 100 in which the corner area is formed in a round shape, the inner area 112 is formed in a flat structure, so that the step between the lower electrode layer corresponding to the cathode electrode and the touch electrode metal TEM is almost constant. However, the step between the lower electrode layer and the touch electrode metal TEM in the edge area 114 rapidly decreases as moving away from the inner area 112.

Accordingly, the parasitic capacitance Cp formed between the lower electrode layer and the touch electrode metal TEM is rapidly increased by the step Step between the lower electrode layer and the touch electrode metal TEM.

At this time, the parasitic capacitance Cp formed between the lower electrode layer and the touch electrode metal TEM increases as the step Step between the lower electrode layer and the touch electrode metal TEM decreases. If the increased parasitic capacitance Cp in edge area 114 is out of the allowable maximum range Max Spec for touch sensing, an operation of touch sensing may not be properly performed in the edge area 114.

Therefore, it is beneficial for structure to compensate for the increase in parasitic capacitance Cp by reducing the step Step between the touch electrode metal TEM and the lower electrode layer in the edge area 114 of the touch display device 100.

The inventors of the present disclosure provide a critical dimension (CD) compensation area capable of compensating for a change in capacitance due to a decrease in a step between the touch electrode metal TEM and the lower electrode layer in the edge area 114 of the touch display device 100, so that it is possible to obtain improved touch sensitivity.

Figure 6:
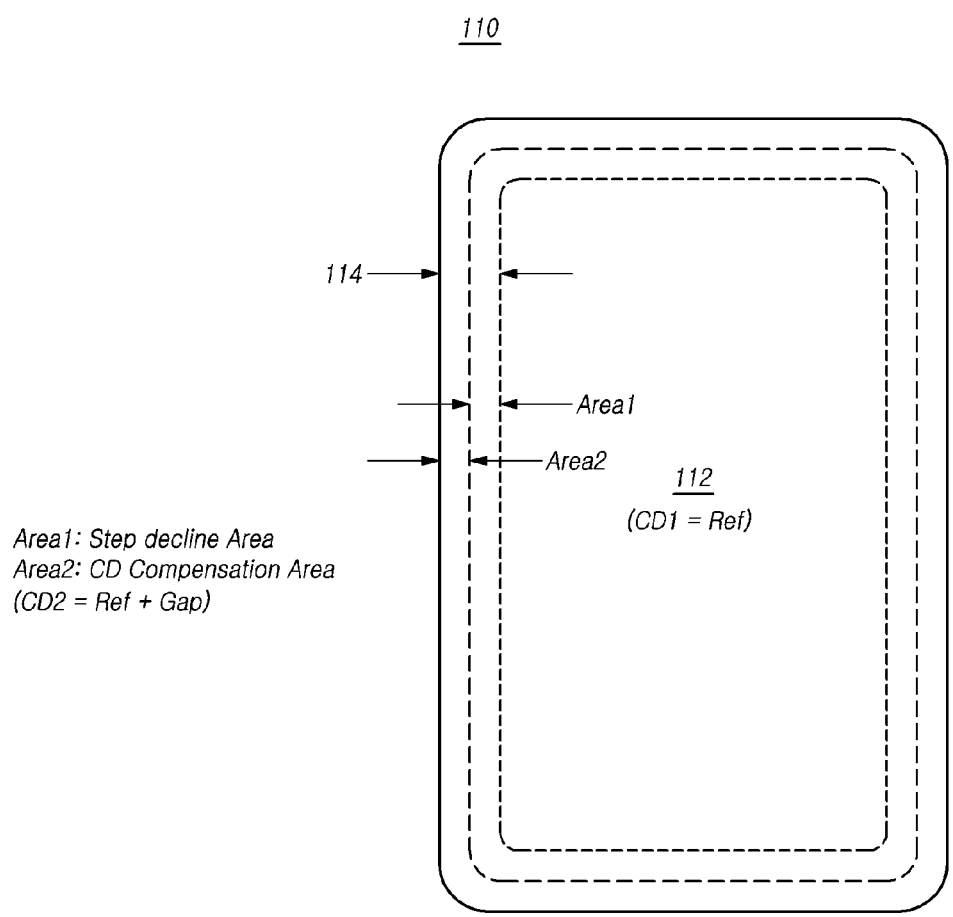
FIG. 6 is a diagram schematically illustrating a display panel according to embodiments of the present disclosure.

FIG. 6 is a diagram schematically illustrating a display panel according to embodiments of the present disclosure.

Referring to FIG. 6, an area in which a touch electrode metal TEM is disposed in the display panel 110 according to one or more embodiments of the present disclosure may be divided into an inner area 112 and an edge area 114.

The inner area 112 is an area of the central portion surrounded by the left and right edge area 114, and is an area formed by a flat planar structure.

Since the thickness of the encapsulation layer Encap formed between the touch electrode metal TEM and the lower electrode layer is substantially constant in the inner area 112, a critical dimension (CD) of the touch electrode metal TEM formed in the inner area 112 corresponding to the line width of the touch electrode metal TEM may be formed to have a constant reference critical dimension Ref.

Meanwhile, the edge area 114 is an area formed in a round shape extending in the left or right, upper or lower direction of the inner area 112, and is an area where the step Step of the encapsulation layer Encap formed between the touch electrode metal TEM and the lower electrode layer is decreased in an outer direction away from the inner area 112.

At this time, when the step Step between the touch electrode metal TEM and the lower electrode layer is decreased, as described above, the parasitic capacitance Cp is increased, so that the touch sensitivity may be lowered.

Accordingly, some region in the edge area 114 is formed as a CD compensation area Area2 and a critical dimension CD2 of the touch electrode metal TEM located in the CD compensation area Area2 is formed larger than a critical dimension CD1 of the touch electrode metal TEM located in the inner area 112. As a result, it is possible to prevent an increase in parasitic capacitance Cp and improve the touch sensitivity.

For example, the edge area 114 may be divided into a step decline area Area1 and a CD compensation area Area2.

The step decline area Area1 is an area formed at a position adjacent to the inner area 112 among the edge area 114, and is an area where the step Step between the touch electrode metal TEM and the lower electrode layer is decreased by the round shape of the edge area 114.

On the other hand, the CD compensation area Area2 is an area having a constant width from the point where the step decline area Area1 ends, and the critical dimension CD2 of the touch electrode metal TEM formed in the CD compensation area Area2 is formed to be larger than the critical dimension CD1 of the touch electrode metal TEM formed in the inner area 112 by a constant gap Gap.

In this case, the CD compensation area Area2 may be an area where the step Step2 between the touch electrode metal TEM and the lower electrode layer has a constant value.

Since the critical dimension CD2 of the touch electrode metal TEM formed in the CD compensation area Area2 is larger than the critical dimension CD1 of the touch electrode metal TEM formed in the inner area 112, it is possible to diminish an increase of parasitic capacitance Cp formed between the touch electrode metal TEM and the lower electrode layer in the edge area 114.

At this time, since the step decline area Area1 is located adjacent to the inner area 112, the critical dimension CD of the touch electrode metal TEM formed in the step decline area Area1 may be same value as the critical dimension CD1 of the touch electrode metal TEM formed in the inner area 112. In this case, it can be considered that the step decline area Area1 is included in the inner area 112.

On the other hand, since the step decline area Area1 is also adjacent to the CD compensation area Area2, the critical dimension CD of the touch electrode metal TEM formed in the step decline area Area1 may be same value as the critical dimension CD2 of the touch electrode metal TEM formed in the CD compensation area Area2.

When the critical dimension CD of the touch electrode metal TEM formed in the step decline area Area1 is the same value as the critical dimension CD2 of the touch electrode metal TEM formed in the CD compensation area Area2, it can be considered that the step decline area Area1 is included in the CD compensation area Area2.

Such CD compensation area Area2 may be formed in the edge area 114 located on the left or right side of the display panel 110, or formed in the upper or lower edge area 114 depending on the type of the display panel 110.

Figure 7:
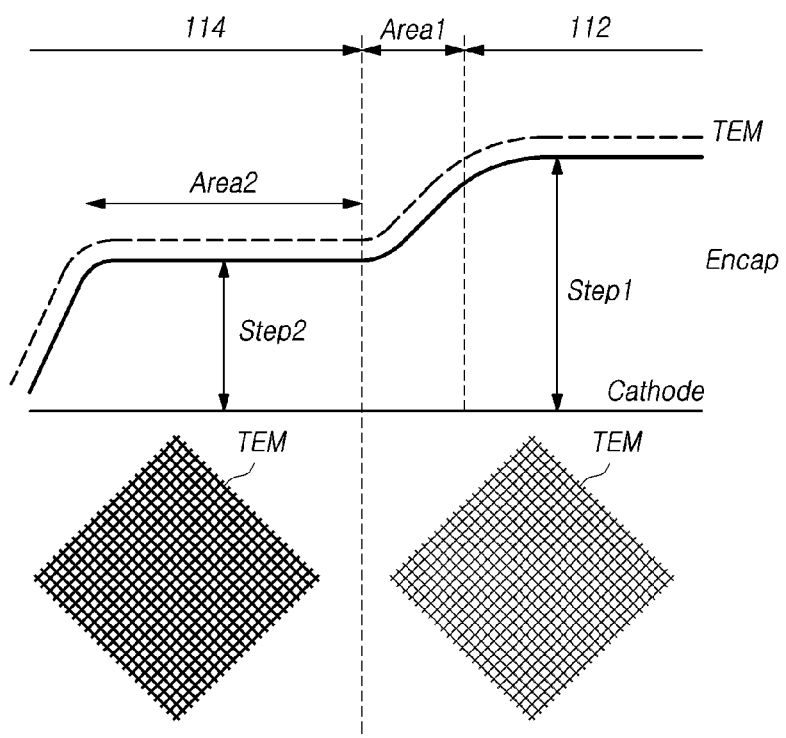
FIG. 7 is a cross-sectional view schematically illustrating critical dimensions of touch electrode metals according to steps between touch electrode metals and a lower electrode layer in an inner area and an edge area of a display panel according to one or more embodiments of the present disclosure.

FIG. 7 is a cross-sectional view schematically illustrating critical dimensions of touch electrode metals according to steps between touch electrode metals and a lower electrode layer in an inner area and an edge area of a display panel according to one or more embodiments of the present disclosure.

Referring to FIG. 7, the inner area 112 in the display panel 110 according to one or more embodiments of the present disclosure may have a constant step Step1 which is a thickness of an encapsulation layer Encap formed between the touch electrode metal TEM and the lower electrode layer.

Since the edge area 114 has a curvature of a round shape, an area adjacent to the inner area 112 in the edge area 114 corresponds to the step decline area Area1 where the step between the touch electrode metal TEM and a lower electrode layer decreases at a constant rate.

The width of the step decline area Area1 may vary depending on the size or structure of the display panel 110.

A CD compensation area Area2, in which the step Step2 between the touch electrode metal TEM and the lower electrode layer is constant, is formed from the point where the step decline area Area1 having a constant width ends.

The critical dimension CD2 of the touch electrode metal TEM in the CD compensation area Area2 is formed to be larger than the critical dimension CD1 of the touch electrode metal TEM formed in the inner area 112 in order to prevent an increase of parasitic capacitance Cp caused by a decrease of the step Step2 between the touch electrode metal TEM and the lower electrode layer.

In the CD compensation area Area2, the step Step2 between the touch electrode metal TEM and the lower electrode layer may be a smaller value than the step Step1 of the inner area 112.

The step Step2 in the CD compensation area Area2 may vary according to the width of the step decline area Area1 and the step decline rate in the step decline area Area1.

When the CD compensation area Are2 is formed inside the edge area 114, an increase in parasitic capacitance Cp occurring in the edge area 114 having a round shape may be suppressed.

The CD compensation area Area2 may be formed as one area or may be formed as a plurality of areas in the edge area 114.

Figure 8:
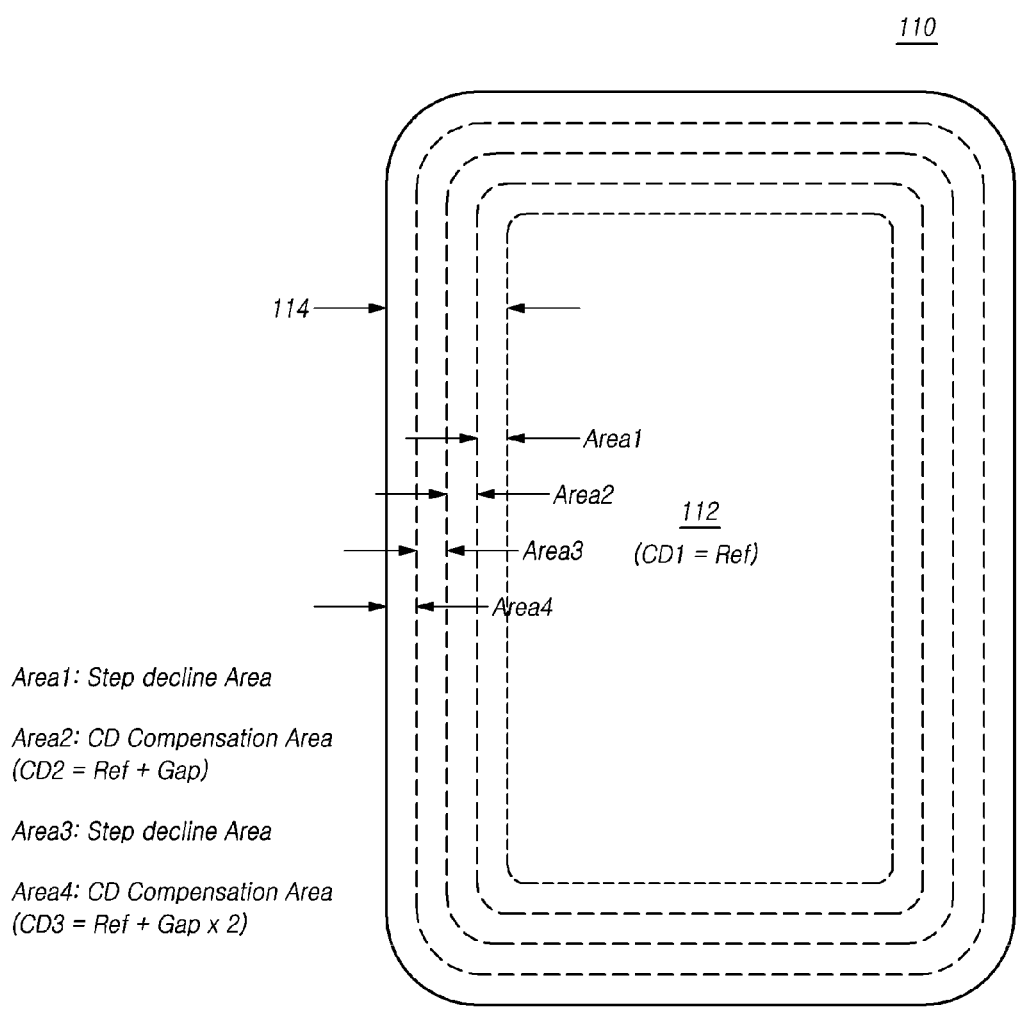
FIG. 8 is a diagram illustrating a case, in which CD compensation area is formed as a plurality of areas in a display panel according to one or more embodiments of the present disclosure.
Figure 9:
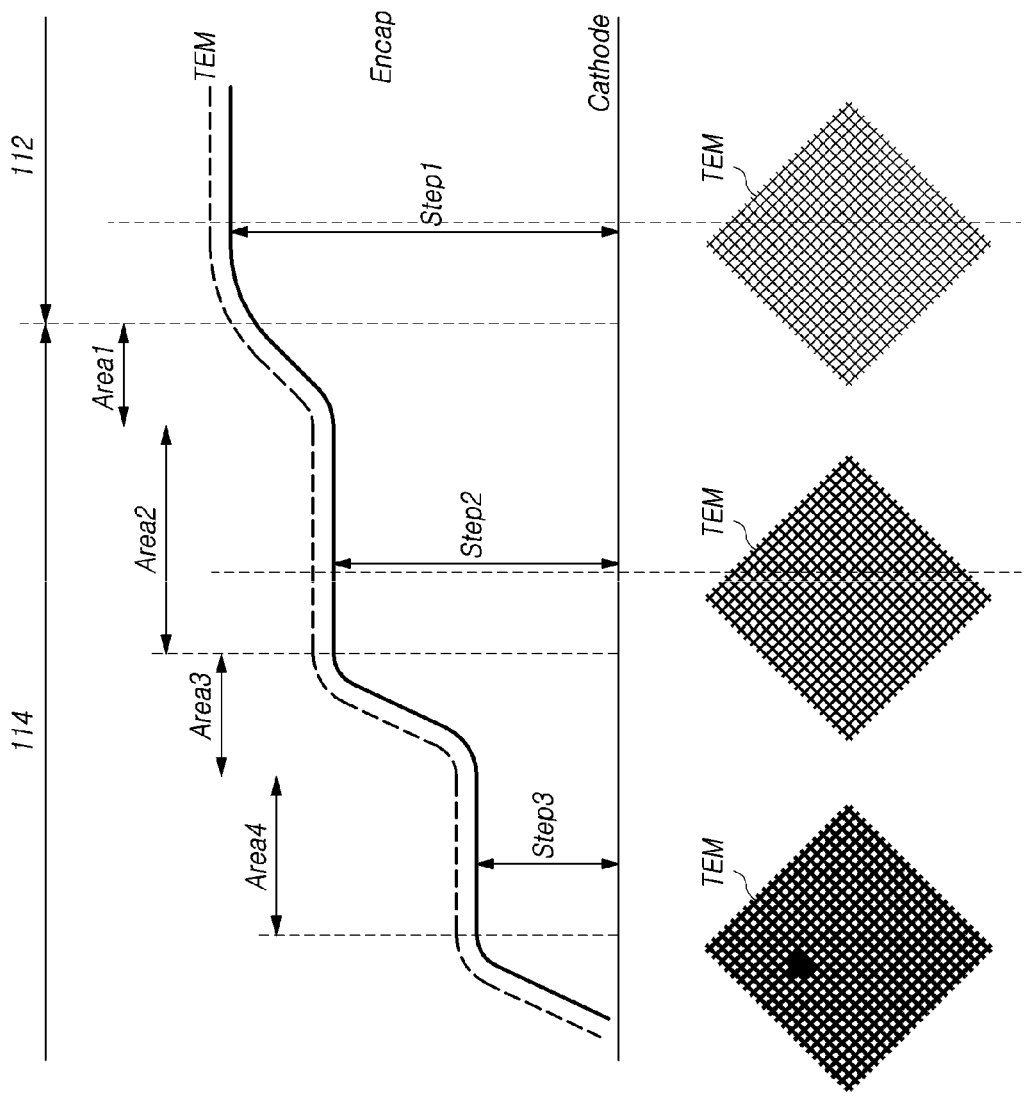
FIG. 9 is a cross-sectional view schematically illustrating steps between touch electrode metals and a lower electrode layer when CD compensation area is formed as a plurality of areas in a display panel according to one or more embodiments of the present disclosure.

FIG. 8 is a diagram illustrating a case, in which CD compensation area is formed as a plurality of areas in a display panel according to one or more embodiments of the present disclosure, and FIG. 9 is a cross-sectional view schematically illustrating steps between touch electrode metals and a lower electrode layer when CD compensation area is formed as a plurality of areas in a display panel according to one or more embodiments of the present disclosure.

Referring to FIG. 8 and FIG. 9, areas in which the touch electrode metal TEM is disposed in the display panel 110 according to one or more embodiments of the present disclosure may be divided into an inner area 112 and an edge area 114.

The inner area 112 is an area of the central portion surrounded by the left and right edge area 114, and is formed by a flat planar structure. A critical dimension CD1 of the touch electrode metal TEM formed in the inner area 112 may have a constant reference critical dimension Ref.

Meanwhile, the edge area 114 is an area extending in the left or right, upper or lower direction of the inner area 112 and is formed in a round shape. In the edge area 114, the step Step between the touch electrode metal TEM and the lower electrode layer decreases toward the outer direction away from the inner area 112.

In this case, by forming a plurality of CD compensation areas in the edge area 114, it is possible to prevent an increase in parasitic capacitance Cp and improve the touch sensitivity.

For example, the edge area 114 may be divided into a plurality of step decline areas Area1, Area3 and a plurality of CD compensation areas Area2, Area4.

In this case, the step decline area Area1 is an area in which the step between the touch electrode metal TEM and the lower electrode layer is uniformly reduced by the round shape of the edge area 114 within the edge area 114.

On the other hand, the CD compensation areas Area2, Area4 are areas having a constant width from the end point of the step decline areas Area1, Area3. In the CD compensation areas Area2, Area4, the steps Step2, Step3 between the touch electrode metal TEM and the lower electrode layer are respectively maintained at each constant value, but the critical dimensions CD2, CD3 of the touch electrode metal TEM increases step by step as the distance from the inner area 112 increases.

At this time, the CD compensation areas Area2, Area4 may be alternately formed adjacent to the step decline areas Area1, Area3 respectively.

For example, the first CD compensation area Area2 is formed in a position adjacent to the first step decline area Area1, and its step Step2 between the touch electrode metal TEM and the lower electrode layer is smaller than the step Step 2 between the touch electrode metal TEM and the lower electrode layer in the inner area 112.

A second step decline area Area3 is formed from the end point of the first CD compensation area Area2 in which the critical dimension CD2 of the touch electrode metal TEM is constant. In the second step decline area Area3, the step between the touch electrode metal TEM and the lower electrode layer decreases again.

The step decline rate of the second step decline area Area3 may be the same as or different from the step decline rate of the first step decline area Area1.

The second CD compensation area Area4 may be formed with a constant width from the end point of the second step decline area Area3. In the second CD compensation area Area4, the critical dimension CD3 of the touch electrode metal TEM may be formed with larger size than the critical dimension CD2 of the touch electrode metal TEM in the first CD compensation area Area2.

A gap Gap between the critical dimension CD3 of the touch electrode metal TEM formed in the second CD compensation area Area4 and the critical dimension CD2 of the touch electrode metal TEM formed in the first CD compensation area Area2 may be the same as or different from a gap between the critical dimension CD2 of the touch electrode metal TEM formed in the first CD compensation area Area2 and the critical dimension CD1 of the touch electrode metal TEM formed in the inner area 112.

That is, the critical dimension CD of the touch electrode metal TEM formed in the CD compensation area Are2, Area4 may increase at a constant rate or at a different rate as the distance from the inner area 112.

As described above, when the plurality of CD compensation areas Area2, Area4 are formed inside the edge area 114, the increase in the parasitic capacitance Cp formed by the step Step1 between the touch electrode metal TEM and the lower electrode layer in the edge area 114 may be diminished step by step, so that it is possible to effectively prevent the decrease in touch sensitivity due to the parasitic capacitance Cp.

Figure 10:
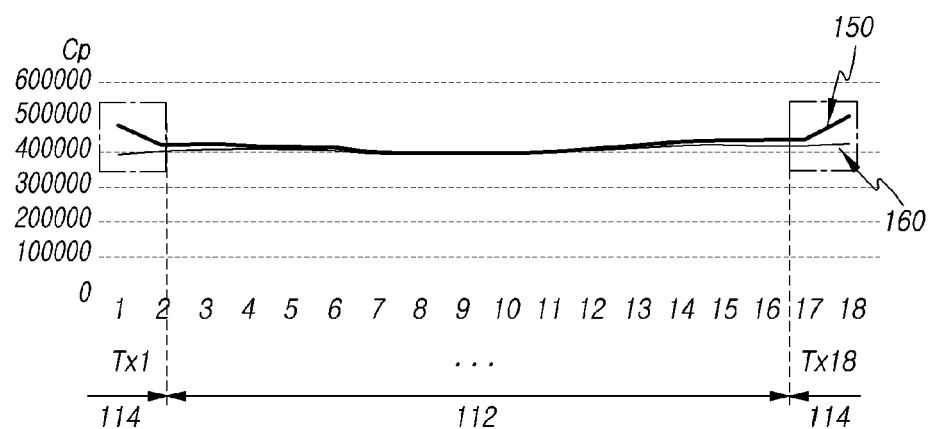
FIG. 10 is a diagram illustrating a change in capacitance according to steps between touch electrode metals and a lower electrode layer in an inner area and an edge area of a touch display device according to one or more embodiments of the present disclosure.

FIG. 10 is a diagram illustrating a change in capacitance according to steps between touch electrode metals and a lower electrode layer in an inner area and an edge area of a touch display device according to one or more embodiments of the present disclosure.

Referring to FIG. 10, forming a CD compensation area in the edge area 114 of the touch display device 100 according to one or more embodiments of the present disclosure, it can be seen that the parasitic capacitance Cp formed between the touch electrode metal TEM and the lower electrode layer is reduced in the edge area 114.

Comparing a critical dimension of the touch electrode metal TEM remains the same without forming the CD compensation area 150, it is possible to suppress the increase in the parasitic capacitance Cp in the edge area 114 and improve the touch sensitivity in the edge area 114.

The CD compensation area may be applied to all the edge areas 114 including the corner area as well as the left or right, upper or lower side of the display panel 110.

Figure 11:
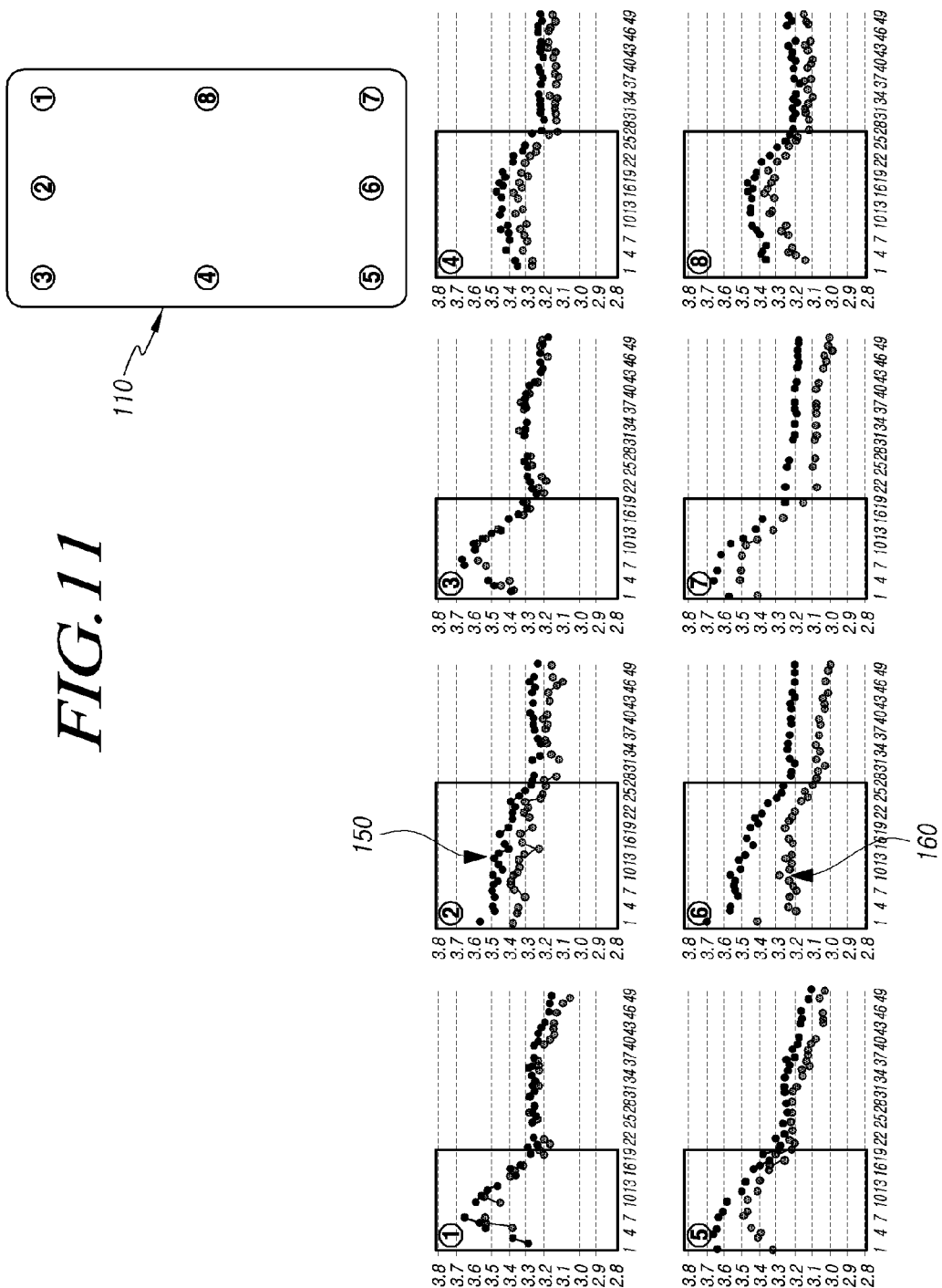
FIG. 11 is a diagram illustrating a change in capacitance according to steps between touch electrode metals and a lower electrode layer in eight edge areas of a touch display device according to one or more embodiments of the present disclosure.

FIG. 11 is a diagram illustrating a change in capacitance according to steps between touch electrode metals and a lower electrode layer in eight edge areas of a touch display device according to one or more embodiments of the present disclosure.

Referring to FIG. 11, the CD compensation area in the touch display device 100 according to one or more embodiments of the present disclosure may be formed in all edge areas 114 including the left or right, upper or lower side, and corner areas of the display panel 110.

In this way, in a case 160 forming the CD compensation area in the edge area 114, the parasitic capacitance Cp formed between the touch electrode metal TEM and the lower electrode layer in the edge area 114 is reduced. Therefore, comparing a case 150 where the critical dimension CD of the touch electrode metal TEM is formed identically without forming the CD compensation area, increase in the parasitic capacitance Cp in the edge area 114 may be suppressed.

Further embodiments of the present disclosure provides a touch display device that includes a display panel including an inner area and an edge area adjacent to the inner area. The edge area has at least one critical dimension (CD) compensation area.

The display panel includes a touch electrode metal. The touch electrode metal has a first touch electrode metal with a first critical dimension and a second touch electrode metal with a second critical dimension larger than the first critical dimension. The first touch electrode metal is indicative of a first part of the touch electrode metal and the second touch electrode metal is indicative of a second part of the touch electrode metal. The first part and the second part are adjacent to each other.

The display panel includes a lower electrode layer.

The display panel includes a first step between the first touch electrode metal and the lower electrode layer in the inner area.

The display panel includes a second step between the second touch electrode metal and the lower electrode layer in the edge area.

The display panel includes a touch circuit operatively connected to the display panel for sensing at least one of touch presence or touch location by using a touch sensing signal received from the first and second touch electrode metals.

In some embodiments, the first step is maintained at a constant value in at least some areas of the inner area.

In some embodiments, the lower electrode layer is a cathode electrode of a light emitting element.

In some embodiments, the second critical dimension has a value larger than the first critical dimension by a constant gap.

In some embodiments, the second step has a smaller size than the first step and the second step is maintained at a constant value in at least some areas of the edge area.

In some embodiments, the touch display device further includes a first step decline area between the first part and the second part of the touch electrode metal. The first step decline area has a height of a step between the touch electrode metal and the lower electrode layer decreasing from the first part to the second part. The step decline area is adjacent to a first CD compensation area of the at least one critical dimension (CD) compensation area.

In some embodiments, the touch electrode metal includes a third touch electrode metal indicative of a third part of the touch electrode metal. The third part is adjacent to the second part.

In some embodiments, the touch display device further includes a second step decline area between the second part and the third part of the touch electrode metal. The second step decline area has a height of a step between the touch electrode metal and the lower electrode layer decreasing from the second part to the third part. The second step decline area is adjacent to a second CD compensation area of the at least one critical dimension (CD) compensation area.

In some embodiments, a first step decline rate of the first step decline area is substantially the same as a second step decline rate of the second step decline area.

In some embodiments, a first step decline rate of the first step decline area different from a second step decline rate of the second step decline area.

In some embodiments, the critical dimension of the first and second touch electrode metals formed in the CD compensation area increases as the distance from the inner area increases when the CD compensation area is formed as a plurality of areas.

In some embodiments, the critical dimension of the first and second touch electrode metals formed in the CD compensation area increases at a constant rate as the distance from the inner area increases.

Additional embodiments of the present disclosure provides a display panel that includes an inner area having a first step between a first touch electrode metal with a first critical dimension and a lower electrode layer, and an edge area having at least one of CD compensation area, which is located outside of the inner area. The edge area has a second step between a second touch electrode metal with a second critical dimension larger than the first critical dimension and the lower electrode layer.

In some embodiments, the first step is maintained at a constant value.

In some embodiments, the lower electrode layer is a cathode electrode of a light emitting element.

In some embodiments, the second critical dimension has a value larger than the first critical dimension by a constant gap.

In some embodiments, the second step has a smaller size than the first step and is maintained at a constant value.

In some embodiments, the display panel further includes a step decline area in which the first step between the first touch electrode metal and the lower electrode layer decreases adjacent to the CD compensation area and in which the second step between the second touch electrode metal and the lower electrode layer decreases adjacent to the CD compensation area.

In some embodiments, a step decline rate of the step decline area is the same or different when the step decline area is formed as a plurality of areas.

In some embodiments, the critical dimension of at least one of the first and second touch electrode metals formed in the CD compensation area increases as the distance from the inner area increases when the CD compensation area is formed as a plurality of areas.

In some embodiments, the critical dimension of at least one of the first and second touch electrode metals formed in the CD compensation area increases at a constant rate as the distance from the inner area increases.

The above description merely exemplifies the technical idea of the present disclosure, and various modifications and changes such as combination, separation, substitution, and alteration of configurations can be made by those skilled in the art without departing from the essential features of the disclosure. Accordingly, the embodiments of the present disclosure are not to restrict the technical idea of the disclosure but to explain the technical idea of the present disclosure. The technical idea of the present disclosure is not limited to the embodiments. The scope of the present disclosure is defined by the appended claims, and all the technical ideas within a range equivalent thereto should be construed as belonging to the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device, comprising:
    a display panel including,
        an inner area;
        an edge area spaced from the inner area;
        a step decline area between the inner area and the edge area;
        a light emitting element located within the inner area, the light emitting element including an anode layer, a cathode layer, and an organic light emitting layer between the anode layer and the cathode layer;
        an encapsulation layer on the cathode layer of the light emitting element;
        a touch electrode including a touch electrode metal on the encapsulation layer; and a touch circuit operatively connected to the display panel for sensing at least one of touch presence or touch location by using a touch sensing signal received from the touch electrode metals, wherein the edge area includes a first compensation area that is a part of a region in the edge area, wherein, in the inner area, the touch electrode metal has a first line width of a line for patterning the touch electrode metal in a mesh shape, and the encapsulation layer between the touch electrode metal and the cathode layer, has a first, substantially constant thickness, wherein, in the first compensation area the touch electrode metal has a second line width of a line for patterning the touch electrode metal in a mesh shape, which is wider than the first line width, and wherein the encapsulation layer thickness in the step decline are between the inner area and the first compensation area is reduce throughout the entire step decline area.

2. The touch display device according to claim 1, further including a second compensation area, wherein the first compensation area is formed in a position adjacent to the first step decline area and in which a step between the touch electrode metal and the cathode electrode layer is smaller than a step in the inner area, wherein the second step decline area, in which a step between the touch electrode metal and the cathode electrode layer decreases again, is further formed from the end of the first compensation area to the second compensation area, and wherein a line-width of the touch electrode metal in the second compensation area is larger than a line-width of the touch electrode metal in the first compensation area.

3. The touch display device according to claim 2, wherein a step decline rate of the first step decline area is substantially the same as a step decline rate of the second step decline area.

4. The touch display device according to claim 2, wherein a step decline rate of the first step decline area is different from a step decline rate of the second step decline area.

5. The touch display device according to claim 1, wherein the second line width of the touch electrode metal in the first compensation area increases at a constant rate as the distance from the inner area increases.

6. A display panel, comprising:

an inner area, an edge area adjacent to the inner area;

a light emitting element including an anode layer, a cathode layer, and an organic light emitting layer between the anode layer and the cathode layer;

an encapsulation layer on the cathode layer of the light emitting element;

a touch electrode including a touch electrode metal on the encapsulation layer; and a first step in the thickness of the encapsulation layer in the inner area positioned between the cathode layer and the touch electrode layer, wherein the edge area includes a first compensation area which is a part of a region in the edge area, wherein, in the inner area, the touch electrode metal has a first line width of a line for patterning the touch electrode metal in a mesh shape, and the first step has a constant value thickness of the encapsulation layer between the touch electrode metal and the cathode layer, wherein, in a second compensation area the touch electrode metal has a second line width of a line for patterning the touch electrode metal in a mesh shape that is larger than the first line width, and wherein a second step that has a thickness of the encapsulation layer between the touch electrode metal and the cathode layer, has a constant value smaller than the first step in the inner area.

7. The display panel according to claim 6, further comprising:

a first step decline area formed in the edge area at a position adjacent to the inner area, and in which a step between the touch electrode metal and the cathode electrode layer is decreased.

8. The display panel according to claim 7, wherein the first compensation area is formed in a position adjacent to the first step decline area and in which a step between the touch electrode metal and the cathode electrode layer is smaller than the step in the inner area, and in the second compensation area, wherein a second step decline area, in which a step between the touch electrode metal and the cathode electrode layer decreases again, is further formed from the end of the first compensation area to the second compensation area, wherein the line-width of the touch electrode metal in the second compensation area is larger than the line-width of the touch electrode metal in the first compensation area, and wherein a step decline rate of the first step decline area is the same or different from a step decline rate of the second step decline area.

9. The display panel according to claim 6, wherein the second width of the touch electrode metal formed in the first compensation area increases as the distance from the inner area increases.

10. The display panel according to claim 6, wherein the second width of the touch electrode metal formed in the first compensation area increases at a constant rate as the distance from the inner area increases.

* * * * *